(12) United States Patent
Gruber et al.

(10) Patent No.: US 12,034,450 B2
(45) Date of Patent: Jul. 9, 2024

(54) APPARATUS FOR CORRECTING A MISMATCH, DIGITAL-TO-ANALOG CONVERTER SYSTEM, TRANSMITTER, BASE STATION, MOBILE DEVICE AND METHOD FOR CORRECTING A MISMATCH

(71) Applicant: Intel Corporation, Santa Clara, CA (US)

(72) Inventors: Daniel Gruber, St. Andrae (AT); Ramon Sanchez, Galapagar (ES); Kameran Azadet, San Ramon, CA (US); Martin Clara, Santa Clara, CA (US)

(73) Assignee: Intel Corporation, Santa Clara (CA)

( * ) Notice: Subject to any disclaimer, the term of this patent is extended or adjusted under 35 U.S.C. 154(b) by 78 days.

(21) Appl. No.: 17/754,308

(22) PCT Filed: Dec. 27, 2019

(86) PCT No.: PCT/US2019/068645
§ 371 (c)(1),
(2) Date: Mar. 30, 2022

(87) PCT Pub. No.: WO2021/133401
PCT Pub. Date: Jul. 1, 2021

(65) Prior Publication Data
US 2022/0345143 A1    Oct. 27, 2022

(51) Int. Cl.
H03M 1/10    (2006.01)
H03M 1/06    (2006.01)

(52) U.S. Cl.
CPC ....... *H03M 1/1033* (2013.01); *H03M 1/0626* (2013.01)

(58) Field of Classification Search
CPC ............ H03M 1/1033; H03M 1/0626; H03M 1/0639; H03M 1/1038; H03M 1/68
(Continued)

(56) References Cited

U.S. PATENT DOCUMENTS 6,697,004 B1    2/2004  Galton et al.
7,535,389 B1    5/2009  Teterwak
(Continued)

FOREIGN PATENT DOCUMENTS

WO    2010048362 A2    4/2010

*Primary Examiner* — Jean B Jeanglaude
(74) *Attorney, Agent, or Firm* — SPL Patent Attorneys PartG mbB; Kieran O'Leary

(57) ABSTRACT

An apparatus for correcting a mismatch between a first segment and a second segment of a Digital-to-Analog Converter, DAC, is provided. The first segment generates a first contribution to an analog output signal of the DAC based on a first number of bits of a digital input word for the DAC converter, and the second segment generates a second contribution based on a second number of bits. Further, the apparatus comprises a first processing circuit for the first number of bits comprising a first filter configured to modify the first number of bits to generate first modified bits, and a second processing circuit comprising a second filter to modify the second number of bits to generate second modified bits. The apparatus additionally comprises an output configured to output a modified digital input word for the DAC, which is based on the first modified bits and the second modified bits.

25 Claims, 7 Drawing Sheets

(58) Field of Classification Search
USPC .................................................. 341/120, 155
See application file for complete search history.

(56) References Cited

U.S. PATENT DOCUMENTS

| | | |
|---|---|---|
| 10,069,505 B1 | 9/2018 | Poulton et al. |
| 10,090,854 B1* | 10/2018 | Clara ..................... H03M 1/70 |
| 2007/0024480 A1 | 2/2007 | Schwoerer |
| 2014/0285251 A1 | 9/2014 | Carlson |
| 2016/0344401 A1 | 11/2016 | La Grou |
| 2020/0389180 A1* | 12/2020 | Bal ..................... H03M 1/1019 |

* cited by examiner

APPARATUS FOR CORRECTING A MISMATCH, DIGITAL-TO-ANALOG CONVERTER SYSTEM, TRANSMITTER, BASE STATION, MOBILE DEVICE AND METHOD FOR CORRECTING A MISMATCH

FIELD

The present disclosure relates to segment mismatch correction for a Digital-to-Analog Converter (DAC). In particular, examples relate to an apparatus for correcting a mismatch, a DAC system, a transmitter, a base station, a mobile device and a method for correcting a mismatch.

BACKGROUND

In high resolution DACs, the bits are conventionally grouped in segments (which may be encoded differently, e.g., thermometer or binary). In practice, because of slight fabrication imperfections, for example, each of the segments has a slightly different gain and a slightly different clock skew. This results in a non-linear error causing harmonic and spurious distortions in the DAC output signal.

Hence, there may be a desire for a segment mismatch correction.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
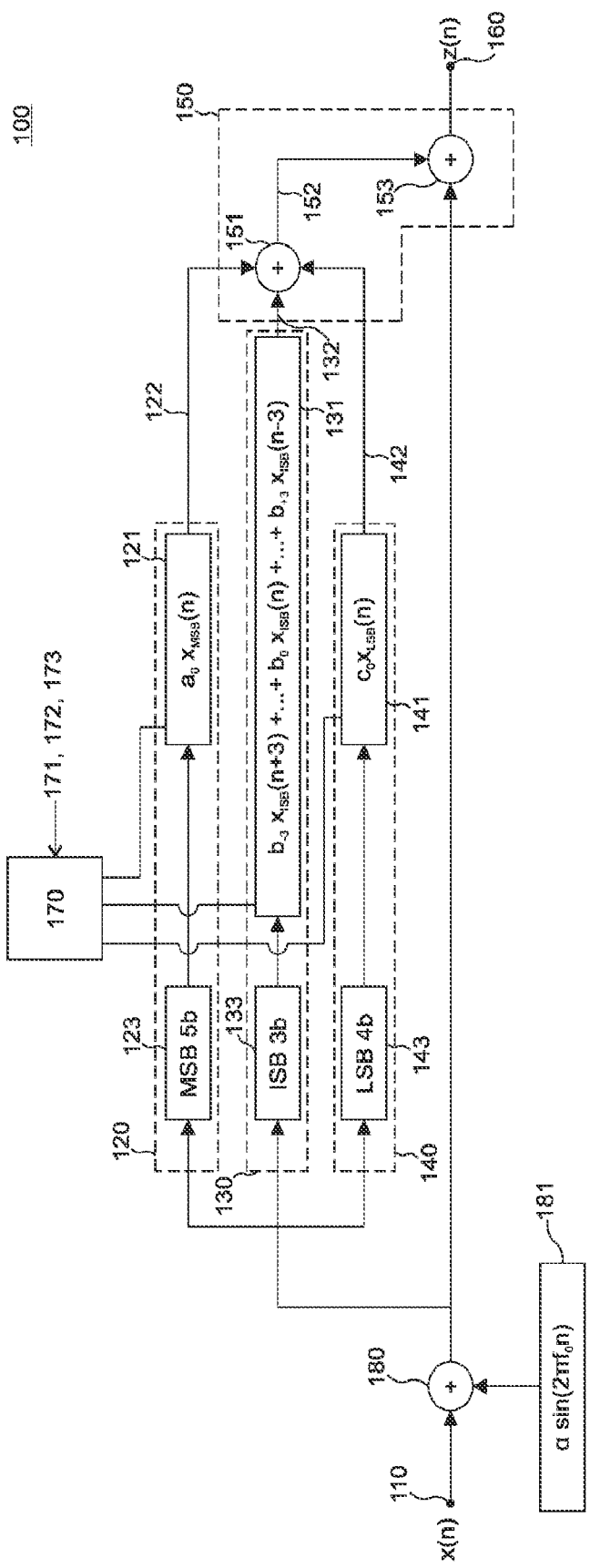
FIG. 1 illustrates a first example of an apparatus for correcting a mismatch.

FIG. 1 illustrates an apparatus 100 for correcting a mismatch between segments of a DAC (not illustrated). Each segment of the DAC comprises one or more respective DAC cells which are activated based on a respective number of bits of a digital input word $x(n)$ for the DAC.

The segments generate a respective contribution to an analog output signal $y(n)$ of the DAC. For example, a first segment generates a first contribution to the analog output signal based on a first number of bits of a digital input word, a second segment generates a second contribution to the analog output signal $y(n)$ based on a second number of bits of the digital input word $x(n)$, and a third segment generates a third contribution to the analog output signal $y(n)$ based on a third number of bits of the digital input word $x(n)$. However, it is to be noted that the DAC may comprise any number of segments, i.e. less or more than three segments. For example, the DAC may comprise two, four, five or more segments.

Each of the, e.g., three segments has a slightly different gain and slightly different clock skew, as well as a slightly different delay to the analog output summing point of the DAC, leading to a gain and phase mismatch between the DAC segments.

For example, if the DAC comprises three segments, the digital input word $x(n)$ may be expressed as follows:

$$x(n) = \text{MSB}(x(n)) + \text{ISB}(x(n)) + \text{LSB}(x(n))$$

$\text{MSB}(x(n))$ denotes a number of most significant bits of the digital input word $x(n)$, $\text{ISB}(x(n))$ denotes a number of intermediate significant bits of the digital input word $x(n)$, and $\text{LSB}(x(n))$ denotes a number of least significant bits of the digital input word $x(n)$.

In order to compensate for the mismatch, the apparatus 100 comprises an input (node) 110 configured to receive the digital input word $x(n)$ as well as a respective processing circuit (line) 120, 130 and 140 for the different numbers of bits controlling the individual segments of the DAC. In the example of FIG. 1, the apparatus 100 comprises the first processing circuit 120 for the first number of bits $\text{MSB}(x(n))$ controlling the first segment, the second processing circuit 130 for the second number of bits $\text{ISB}(x(n))$ controlling the second segment, and the third processing circuit 140 for the third number of bits LSB(x(n)) controlling the third segment.

The first processing circuit 120 comprises a first filter 121 configured to modify (filter) the first number of bits MSB (x(n)) in order to generate first modified bits 122. Similarly, the second processing circuit 130 comprises a second filter 131 configured to modify (filter) the second number of bits ISB(x(n)) in order to generate second modified bits 132. The third processing circuit 140 comprises a third filter 141 configured to modify (filter) the third number of bits LSB (x(n)) in order to generate third modified bits 142.

A combiner circuit 150 of the apparatus 100 is configured to configured to combine the first modified bits 122, the second modified bits 132, the third modified bits 142 and the digital input word x(n) in order to generate a modified digital input word z(n) for the DAC.

Further, the apparatus 100 comprises an output (node) 160 configured to output the modified digital input word z(n) to the DAC.

Filtering the different number of bits controlling the individual segments of the DAC may allow to compensate for the segment mismatch between the individual segments of the DAC. The compensation of the segment mismatch may enable an improved Spurious Free Dynamic Range (SFDR) of the DAC. This will become more clear from the following example:

In the absence of any impairments, y(n)=x(n). If, for example, the delay introduced in the three segments is referred to the first number of bits MSB(x(n)) and the delay of the third number of bits LSB(x(n)) is ignored (because their contribution to x(n) is comparatively small), a single linear filter may be used to model de amplitude and delay of the ISB segment, while a simple gain error can be used for the MSB and LSB segments.

Assuming that x(n) is, for example, an unsigned 12 bit signal, the analog output signal y(n) of the DAC may be modeled as an eleven term sum of products: one term for the first number of bits MSB(x(n)), seven terms for the second number of bits ISB(x(n)) and one term for the third number of bits LSB(x(n)). In terms of a mathematical expression, this may be expressed as follows:

$$Y(n)=(1-a_0)\text{MSB}(x(n))-b_{-3}\text{ISB}(x(n+3))-b_{-2}\text{ISB}(x(n+2))-b_{-1}\text{ISB}(x(n+1))+(1-b_0)\text{ISB}(x(n))-b_{+1}\text{ISB}(x(n-1))-b_{+2}\text{ISB}(x(n-2))-b_{+3}\text{ISB}(x(n-3))+(1-c_0)\text{LSB}(x(n))$$

It is to be noted that the analog output signal y(n) of the DAC may be analogously modelled for digital input words of other bitlengths and/or DACs comprising a different number of segments.

The error e(n) introduced by the segment mismatch may be expressed as follows:

$$e(n)=y(n)-y'(n)=-(a_0\text{MSB}(x(n))+b_{-3}\text{ISBs}(x(n+3))+\ldots+b_0\text{ISB}(x(n))+\ldots+b_{+3}\text{ISB}(x(n-3))+c_0\text{LSB}(x(n)))$$

y'(n) denotes the ideal analog output signal of the DAC.

The proposed compensation for the segment mismatch comprises subtracting the error e(n) from the digital input word x(n). In other words, the digital input word x(n) to the DAC is replaced by the modified digital input word z(n)=x(n)-e(n). The modified digital input word z(n) may be equivalently expressed as $$z(n)=x(n)+a_0\text{MSB}(x(n))+b_{-3}\text{ISBs}(x(n+3))+\ldots+b_0\text{ISB}(x(n))+\ldots+b_{+3}\text{ISB}(x(n-3))+c_0\text{LSB}(x(n))$$

for the above example. The individual coefficients of the above sum of products may be applied to the respective bits of the digital input word x(n) by the filters 121, 131 and 141. It is to be noted that according expressions may be determined for digital input words of other bitlengths and/or DACs comprising different numbers of segments. Analogously, the number of processing circuits may correspond to the number of DAC segments. For example, if the DAC comprises two segments, the apparatus 100 comprises two processing circuits for the individual numbers of bits of the digital input word x(n) that control the segments. If the DAC comprises four segments, the apparatus 100 comprises four processing circuits for the individual numbers of bits of the digital input word x(n) that control the segments.

The first processing circuit 120 further comprises a first extraction circuit 123 configured to extract the first number of bits MSB(x(n)) from the digital input word x(n) and to supply the first number of bits MSB(x(n)) to the first filter 121. Similarly, the second processing circuit 130 further comprises a second extraction circuit 133 configured to extract the second number of bits IS B (x(n)) from the digital input word x(n) and to supply the second number of bits ISB(x(n)) to the second filter 131. The third processing circuit 140 further comprises a third extraction circuit 143 configured to extract the third number of bits LSB(x(n)) from the digital input word x(n) and provide the third number of bits LSB(x(n)) to the third filter 142.

The filter coefficients for individual filters 121, 131 and 141 may be based on a measured error of the respective segment. For example, the filter coefficients of the first filter 121 may be based on a measured error of the first segment. Similarly, the filter coefficients of the second filter 131 may be based on a measured error of the second segment. The filter coefficients of the third filter 141 may be based on a measured error of the third segment. For example, the error of the respective DAC segment may be measured using a least square estimation as different linear response for each of the segments in order to account for amplitude and delay differences between the segments. By means of the adapted filter coefficients of the filters 121, 131 and 141, the measured errors may be subtracted from the digital input word x(n) before it is fed to the DAC.

For adjusting the filter coefficients, the apparatus 100 may further comprise a filter adaptation circuit 170 configured to determine the respective filter coefficients for one or more of the first filter 121, the second filter 131 and third filter 141 based on measured errors 171, 172 and 173 of the first segment, the second segment and the third segment of the DAC (e.g. the errors may be derived from measured linear responses of the segments or other measured quantities).

In the example of FIG. 1, the combiner circuit 150 comprises a first combiner sub-circuit 151 (e.g. an adder circuit) configured to combine the first modified bits 122, the second modified bits 132 and the third modified bits 142 in order to generate a digital correction word 152. Further, the combiner circuit 150 comprises a second combiner sub-circuit 153 (e.g. an adder circuit) configured to combine the digital input word x(n) and the digital correction word 152 in order to generate the modified digital input word z(n). In other examples, the combiner circuit 150 may comprise a single (i.e. only one) adder circuit configured to combine the first modified bits 122, the second modified bits 132, the third modified bits 142 and the digital input word x(n) in order to generate the modified digital input word z(n).

The above described, preventive subtraction of the error e(n) causes a small modification in the value of the digital input word x(n) such that a slightly different content for the individual DAC segments reaches the DAC input, which may cause spurs re-growth. Therefore, the compensation may be not fully effective. In order to reduce the residual spurs, the apparatus 100 may additionally comprise a second combiner circuit 180 coupled between the input 110 and each of the processing circuits (i.e. the first processing circuit 120, the second processing circuit 130 and the third processing circuit 140 in the example of FIG. 1). The second combiner circuit 180 is configured to modify the digital input word x(n) by combining the digital input word x(n) with a signal 181 not related to the digital input word x(n). In other words, the signal 181 may be an arbitrary signal that is not related to the input signal representing the digital input word x(n).

Adding the signal 181 to the digital input word x(n) may allow to randomize the residual error in order to reduce the receptiveness of the residual segment mismatch error in the long term (spurs are thus spread in frequency and, hence, become a less damaging white noise).

An amplitude of the signal 181 may be lower than a full scale of the DAC. For example, the amplitude of the signal is less than 5%, 1%, 0.5% or 0.1% of the full scale of the DAC. The signal 181 may, e.g., exhibit a frequency outside a frequency passband of the DAC. The frequency passband of the DAC is a range of frequencies that can pass through the DAC. The frequency of the signal 181 may be below or above the frequency passband of the DAC (for example the frequency of the signal 181 may be between 0 Hz and ½ of the DAC sampling frequency). For example, the frequency of the signal 181 may be at least one decade below the frequency passband of the DAC. In some examples, the frequency of the signal 181 may be in a stopband of the DAC. Therefore, in some examples, the signal 181 may be a low amplitude and low frequency signal outside the band of interest of the DAC. The signal 161 may, e.g., be a sinusoidal signal. In further examples, the frequency of the signal 181 may be outside a frequency band of interest of an application using the DAC (e.g. outside a frequency band used for RF communication).

The proposed DAC segment mismatch correction may be implemented fully digital such that no extra hardware in the analog domain is need. The proposed DAC segment mismatch correction is flexible and programmable. It may allow to compensate any type of error: e.g. gain and skew. Further, the proposed DAC segment mismatch correction may be used with different degrees of granularity, it could even correct segment fractions or even individual DAC cells. In other words, the above mentioned DAC segments may comprise one or more DAC cells, i.e. the DAC segments may be of arbitrary size.

In the following, a number of variations of the apparatus 100 will be described in connection with FIGS. 2 to 4. In the following, only the differences of the apparatuses illustrated in FIGS. 2 to 4 with respect to the apparatus 100 illustrated in FIG. 1 will be highlighted.

Figure 2:
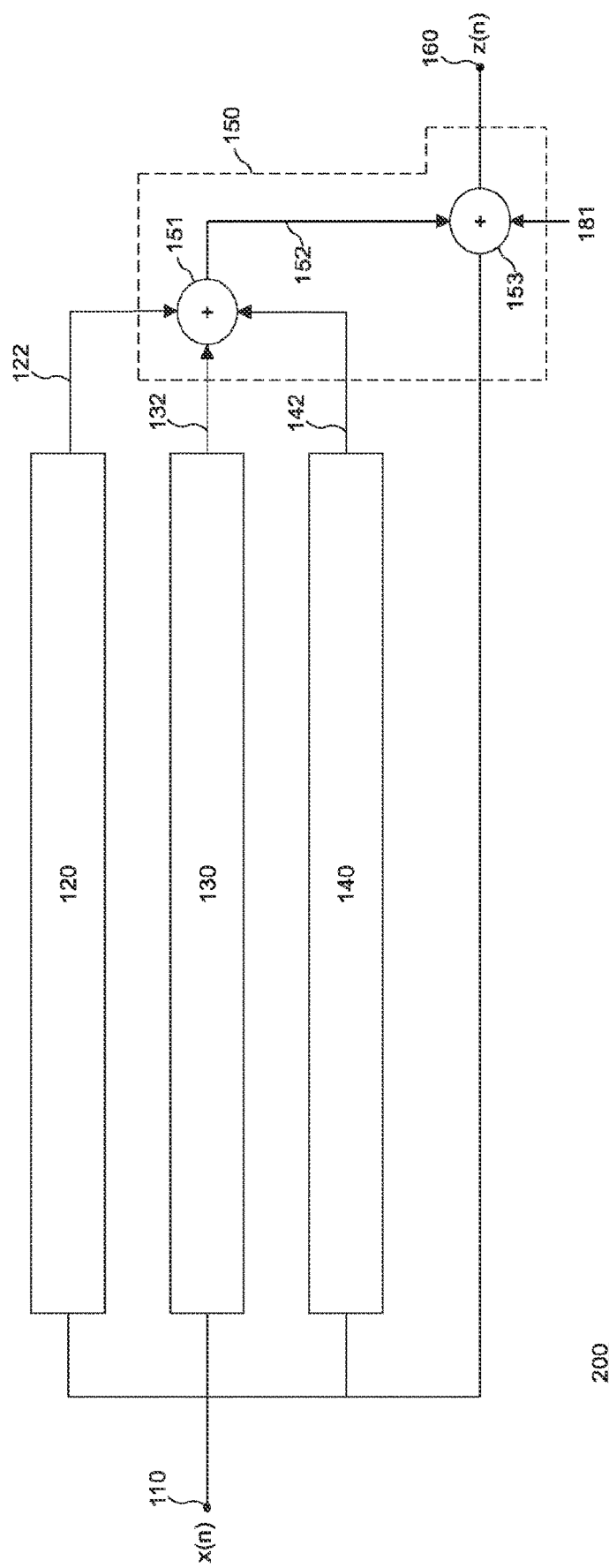
FIG. 2 illustrates a second example of an apparatus for correcting a mismatch.

FIG. 2 illustrates an apparatus 200 for correcting a mismatch between segments of a DAC. In the example of FIG. 2, the second combiner circuit 180 is omitted since the combiner circuit 150 is configured to generate the modified digital input word z(n) further based on the signal 181. In particular, the second combiner sub-circuit 153 is configured to combine the digital input word x(n), the digital correction word 152 and the signal 181 in order to generate the modified digital input word z(n).

Figure 3:
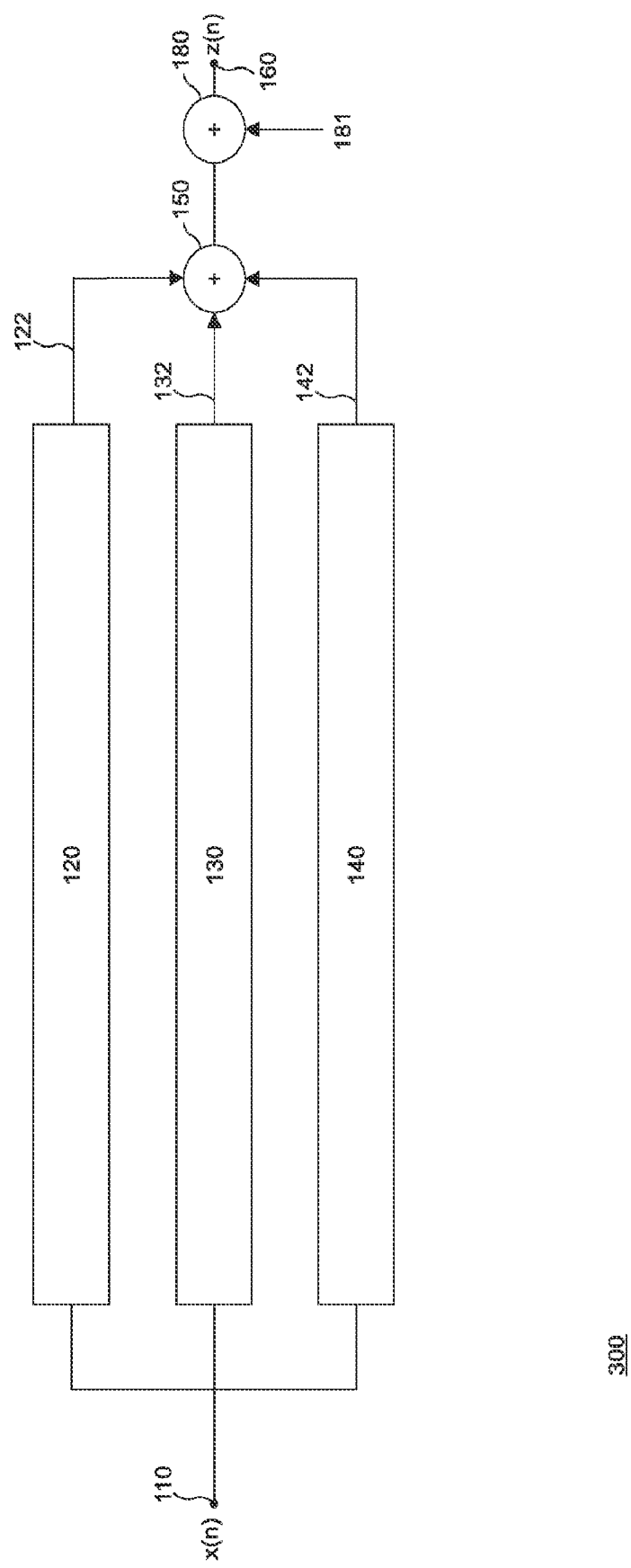
FIG. 3 illustrates a third example of an apparatus for correcting a mismatch.

FIG. 3 illustrates another apparatus 300 for correcting a mismatch between segments of a DAC, in which the second combiner circuit 180 is coupled between the combiner circuit 150 and the output 160. In the example of FIG. 3, the second combiner circuit 180 is configured to modify the modified digital input word z(n) by combining it with the signal 181.

The example of FIG. 3 further differentiates from the example of FIG. 1 in that the combiner circuit 150 combines (only, exclusively) the first modified bits 122, the second modified bits 132 and the third modified bits 142 in order to generate the modified digital input word z(n), but not the digital input word x(n). For example, by deriving the filter coefficients for the filters 121, 131 and 141 differently than in the example of FIG. 1, the first modified bits 122, the second modified bits 132 and the third modified bits 142 may be generated to comprises the modified and corrected output without the need to sum it up with the digital input word x(n).

It is to be noted that the placement of the second combiner circuit 180 between the combiner circuit 150 and the output 160 is independent from the generation of the modified digital input word z(n) by the combiner circuit 150. In alternative examples of the apparatus 100 illustrated in FIG. 1, the second combiner circuit 180 may as well be coupled between the combiner circuit 150 and the output 160.

Figure 4:
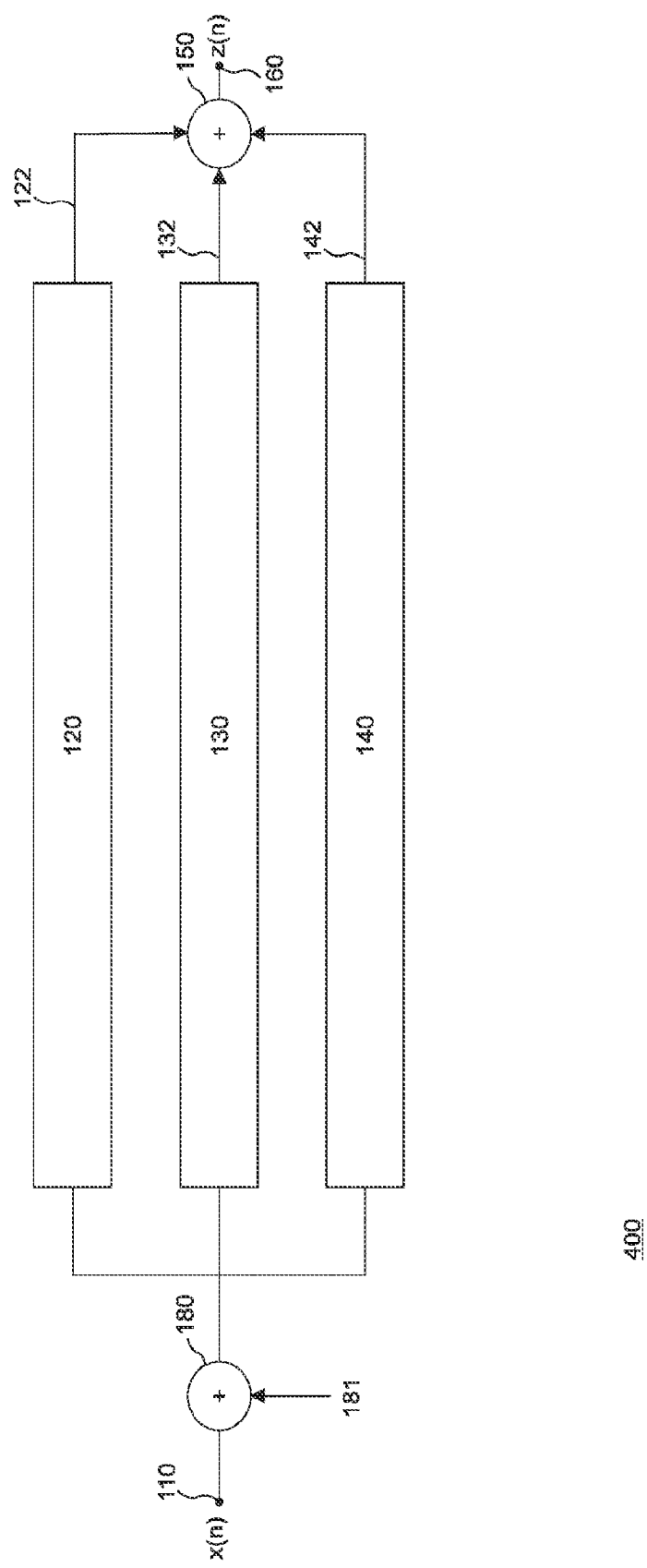
FIG. 4 illustrates a fourth example of an apparatus for correcting a mismatch.

FIG. 4 further illustrates an apparatus 400 for correcting a mismatch between segments of a DAC. In comparison to the apparatus 300 illustrated in FIG. 3, the second combiner circuit 180 is coupled between the input 110 and each of the processing circuits 120, 130 and 140 such that the second combiner circuit 180 modifies the digital input word x(n) by combining it with the signal 181.

For reasons of clarity, the filter adaptation circuit 170 is omitted in FIGS. 2 to 4.

Figure 5:
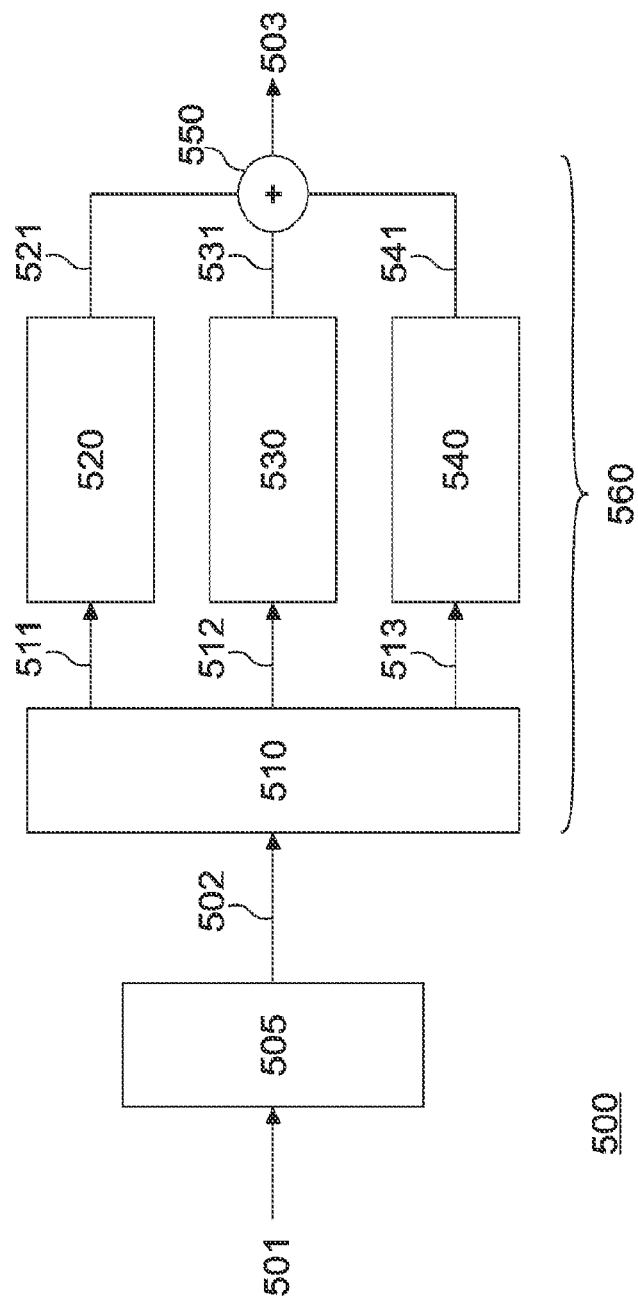
FIG. 5 illustrates an example of a DAC system.

FIG. 5 further illustrates a DAC system 500 comprising an apparatus 505 for mismatch correction according to the proposed architecture and a DAC 560. The apparatus 505 receives the digital input word 501 for the DAC 560 and generates the modified digital input word 502 as described in one of the above examples. For example, the digital input word 501 may comprise user data.

The DAC 560 comprises three segments 520, 530 and 540 each comprising one or more DAC cells. Each of the three segments 520, 530 and 540 generates a respective contribution 521, 531 and 541 to the analog output signal 503 of the DAC 560 (which may be understood as respective segment output signals). The contributions 521, 531 and 541 of the segments 520, 530 and 540 to the analog output signal 503 are combined by a combiner circuit 550 of the DAC 560 (e.g. an adder circuit) in order to obtain the analog output signal 503.

For driving the individual segments 520, 530 and 540, the DAC 560 comprises a control circuit 510. The control circuit 510 generates one or more respective control signals 511, 512 and 513 for the segments 520, 530 and 540 based on the modified digital input word 502. Thus, one or more DAC cells may be activated and/or driven by the control circuit 510 based on the modified digital input word 502. The individual control signals 511, 512 and 513 for the segments 520, 530 and 540 are generated by the control circuit 510 based on the respective number of bits of the modified digital input word 502 for the respective segment 520, 530 and 540.

Accordingly, the DAC 560 may generate the analog output signal 503 with an improved SFDR.

Figure 6:
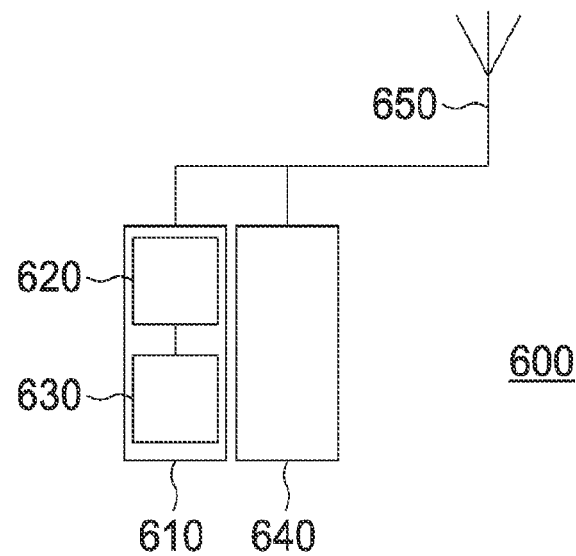
FIG. 6 illustrates an example of a base station.

An example of an implementation using DAC segment mismatch correction according to one or more aspects of the architecture described above in connection with FIGS. 1 to 5 or one or more examples described above in connection with FIGS. 1 to 5 is illustrated in FIG. 6. FIG. 6 schematically illustrates an example of a radio base station 600 (e.g. for a femtocell, a picocell, a microcell or a macrocell) comprising a DAC system 620 as proposed.

The DAC system 620 is part of a transmitter 610. The transmitter 610 additionally comprises a digital circuit 630 configured to supply the digital input word to the input of the apparatus for correcting the DAC segment mismatch. For example, the digital circuit 630 may be configured to generate the digital input word based on data to be wirelessly transmitted.

The base station 600 comprises at least one antenna element 650 coupled to the transmitter 610 for radiating one or more Radio Frequency (RF) transmit signals that are based on the DAC output to the environment. For example, the DAC system 620 may be coupled to the antenna element 650 via one or more intermediate elements such as a filter, an up-converter (mixer) or a Power Amplifier (PA).

Additionally, the base station 600 comprises a receiver 640 configured to receive a RF receive signal from the antenna element 650 or another antenna element (not illustrated) of the base station 600.

To this end, a base station comprising a DAC with improved SFDR for RF transmit signal generation may be provided.

The base station 600 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated cirsuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnay a Sputnikovay a Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 7:
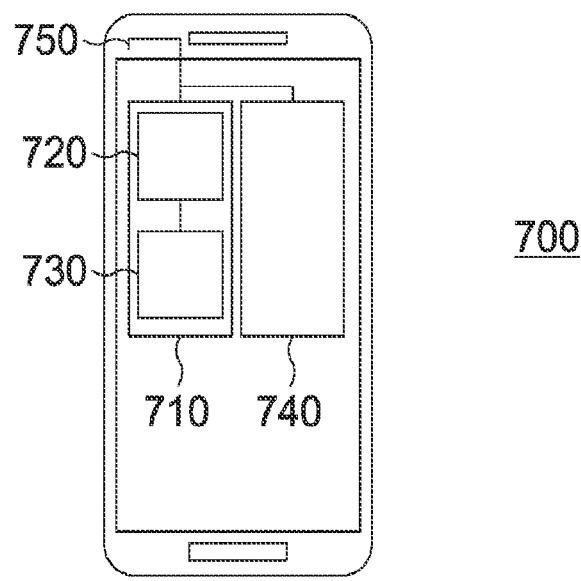
FIG. 7 illustrates an example of a mobile device.

Another example of an implementation using DAC segment mismatch correction according to one or more aspects of the architecture described above in connection with FIGS. 1 to 5 or one or more examples described above in connection with FIGS. 1 to 5 is illustrated in FIG. 7.

FIG. 7 schematically illustrates an example of a mobile device 700 (e.g. mobile phone, smartphone, tablet-computer, or laptop) comprising a DAC system 720 as proposed.

The DAC system 720 is part of a transmitter 710. The transmitter 710 additionally comprises a digital circuit 730 configured to supply the digital input word to the input of the apparatus for correcting the DAC segment mismatch. For example, the digital circuit 730 may be configured to generate the digital input word based on data to be wirelessly transmitted.

The mobile device 700 comprises at least one antenna element 750 coupled to the transmitter 710 for radiating one or more RF transmit signals that are based on the DAC output to the environment. For example, the DAC system 720 may be coupled to the antenna element 750 via one or more intermediate elements such as a filter, an up-converter (mixer) or a PA.

Additionally, the mobile device 700 comprises a receiver 740 configured to receive a RF receive signal from the antenna element 750 or another antenna element (not illustrated) of the mobile device 700.

To this end, a mobile device comprising a DAC with improved SFDR for RF transmit signal generation may be provided.

The mobile device 700 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using ADC segment mismatch correction according to the proposed architectures or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

Figure 8:
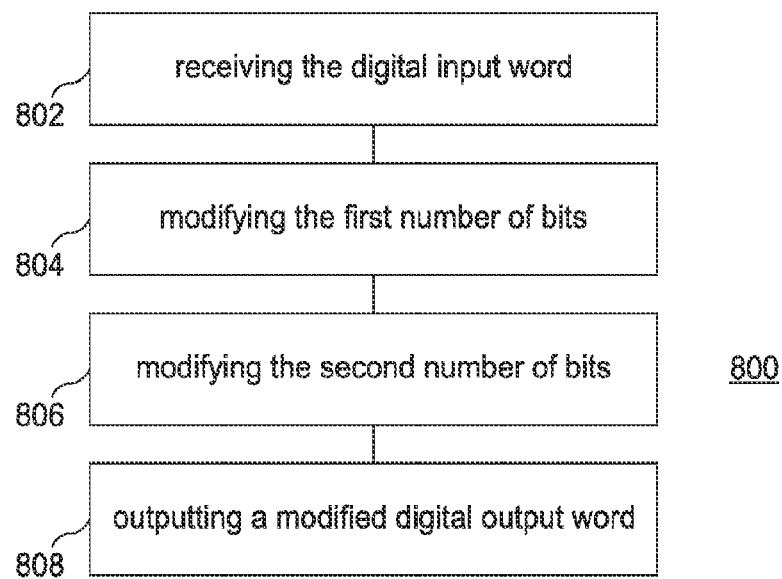
FIG. 8 illustrates a flowchart of an example of a method for correcting a mismatch.

For further illustrating the DAC segment mismatch correction described above, FIG. 8 illustrates a flowchart of a method 800 for correcting a mismatch between a first segment and a second segment of a DAC. The first segment generates a first contribution to an analog output signal of the DAC based on a first number of bits of a digital input word for the DAC, and the second segment generates a second contribution to the analog output signal based on a second number of bits of the digital input word. The method 800 comprises receiving 802 the digital input word. Further, the method 800 comprises modifying 804 the first number of bits in order to generate first modified bits using a first filter in a first processing circuit for the first number of bits. Additionally, the method 800 comprises modifying 806 the second number of bits in order to generate second modified bits using a second filter in a second processing circuit for the second number of bits. Further, the method 800 comprises outputting 810 a modified digital input word for the DAC. The modified digital input word is based on the first modified bits and the second modified bits.

The method 800 may allow segment mismatch correction for the DAC. Accordingly, the method 800 may enable an improved SFDR of the DAC.

More details and aspects of the method 800 are explained in connection with the proposed technique or one or more examples described above (e.g. FIGS. 1 to 5). The method 800 may comprise one or more additional optional features corresponding to one or more aspects of the proposed technique or one or more examples described above.

The examples described herein may be summarized as follows:

Example 1 is an apparatus for correcting a mismatch between a first segment and a second segment of a DAC wherein the first segment generates a first contribution to an analog output signal of the DAC based on a first number of bits of a digital input word for the DAC, and wherein the second segment generates a second contribution to the analog output signal based on a second number of bits of the digital input word, the apparatus comprising: an input configured to receive the digital input word; a first processing circuit for the first number of bits comprising a first filter configured to modify the first number of bits in order to generate first modified bits; a second processing circuit for the second number of bits comprising a second filter configured to modify the second number of bits in order to generate second modified bits; and an output configured to output a modified digital input word for the DAC, wherein the modified digital input word is based on the first modified bits and the second modified bits.

Example 2 is the apparatus of example 1, wherein the first processing circuit further comprises a first extraction circuit configured to extract the first number of bits from the digital input word and to supply the first number of bits to the first filter.

Example 3 is the apparatus of example 1 or example 2, wherein the second processing circuit further comprises a second extraction circuit configured to extract the second number of bits from the digital input word and to supply the second number of bits to the second filter.

Example 4 is the apparatus of any of examples 1 to 3, wherein filter coefficients of the first filter are based on a measured error of the first segment.

Example 5 is the apparatus of any of examples 1 to 4, wherein filter coefficients of the second filter are based on a measured error of the second segment.

Example 6 is the apparatus of any of examples 1 to 5, further comprising: a combiner circuit configured to combine the first modified bits, the second modified bits and the digital input word in order to generate the modified digital input word.

Example 7 is the apparatus of example 6, wherein the combiner circuit comprises: a first combiner sub-circuit configured to combine the first modified bits and the second modified bits in order to generate a digital correction word; and a second combiner sub-circuit configured to combine the digital input word and the digital correction word in order to generate the modified digital input word.

Example 8 is the apparatus of any of examples 1 to 5, further comprising: a combiner circuit configured to combine the first modified bits and the second modified bits in order to generate the modified digital input word.

Example 9 is the apparatus of any of examples 6 to 8, wherein the combiner circuit is further configured to generate the modified digital input word based on a signal not related to the digital input word.

Example 10 is the apparatus of any of examples 6 to 8, further comprising: a second combiner circuit coupled between the combiner circuit and the output, wherein the second combiner circuit is configured to modify the modified digital input word by combining the modified digital input word with a signal not related to the digital input word.

Example 11 is the apparatus of any of examples 1 to 8, further comprising: a second combiner circuit coupled between the input and each of the first processing circuit and the second processing circuit, wherein the second combiner circuit is configured to modify the digital input word by combining the digital input word with a signal not related to the digital input word.

Example 12 is the apparatus of any of examples 9 to 11, wherein an amplitude of the signal is lower than a full scale of the DAC.

Example 13 is the apparatus of example 12, wherein the amplitude of the signal is less than 1% of the full scale of the DAC.

Example 14 is the apparatus of any of examples 9 to 13, wherein the signal exhibits a frequency outside a frequency passband of the DAC.

Example 15 is the apparatus of example 14, wherein the frequency of the signal is below the frequency passband of the DAC.

Example 16 is the apparatus of example 14 or example 15, wherein the frequency of the signal is at least one decade below the frequency passband of the DAC.

Example 17 is the apparatus of any of examples 9 to 16, wherein the signal is a sinusoidal signal.

Example 18 is the apparatus of any of examples 1 to 17, further comprising: a third processing circuit for a third number of bits of the digital input word used by a third segment of the DAC for generating a third contribution to the analog output signal, wherein the third processing circuit comprises a third filter configured to modify the third number of bits in order to generate third modified bits, and wherein the modified digital input word is further based on the third modified bits.

Example 19 is the apparatus of example 18, wherein the third processing circuit further comprises a third extraction circuit configured to extract the third number of bits from the digital input word and provide the third number of bits to the third filter.

Example 20 is the apparatus of example 18 or example 19, wherein filter coefficients of the third filter are based on a measured error of the third segment.

Example 21 is the apparatus of any of examples 18 to 20, wherein the first combiner sub-circuit is configured to combine the first modified bits, the second modified bits and the third modified bits in order to generate the digital correction word.

Example 22 is the apparatus of any of examples 1 to 21, further comprising: a filter adaptation circuit configured to determine respective filter coefficients for the first filter and the second filter based on measured errors of the first segment and the second segment.

Example 23 is a DAC system, comprising: the apparatus according to any of examples 1 to 22; and a DAC coupled to the output of the apparatus.

Example 24 is the DAC system of example 23, wherein the digital input word comprises user data.

Example 25 is a transmitter, comprising: a DAC system according to example 23 or example 24; and a digital circuit configured to supply the digital input word to the input.

Example 26 is the transmitter of example 25, wherein the digital circuit is configured to generate the digital input word based on data to be wirelessly transmitted.

Example 27 is a base station, comprising: a transmitter according to example 25 or example 26; and at least one antenna element coupled to the DAC system.

Example 28 is the base station of example 27, further comprising a receiver configured to receive a radio frequency receive signal from the antenna element.

Example 29 is a mobile device, comprising: a transmitter according to example 25 or example 26; and at least one antenna element coupled to the DAC system.

Example 30 is the mobile device of example 29, further comprising a receiver configured to receive a radio frequency receive signal from the antenna element.

Example 31 is a method for correcting a mismatch between a first segment and a second segment of a DAC wherein the first segment generates a first contribution to an analog output signal of the DAC based on a first number of bits of a digital input word for the DAC, and wherein the second segment generates a second contribution to the analog output signal based on a second number of bits of the digital input word, the method comprising: receiving the digital input word; modifying the first number of bits in order to generate first modified bits using a first filter in a first processing circuit for the first number of bits; modifying the second number of bits in order to generate second modified bits using a second filter in a second processing circuit for the second number of bits; and outputting a modified digital input word for the DAC, wherein the modified digital input word is based on the first modified bits and the second modified bits.

Example 32 is the method of example 31, further comprising: extracting the first number of bits from the digital input word using a first extraction circuit in the first processing circuit; and supplying the first number of bits to the first filter; and/or extracting the second number of bits from the digital input word using a second extraction circuit in the second processing circuit; and supplying the second number of bits to the second filter.

Example 33 is the method of example 31 or example 32, further comprising: modifying the digital input word prior to supplying the digital input word to the first processing circuit and the second processing circuit, wherein modifying the digital input word comprises combining the digital input word with a signal not related to the digital input word; or modifying the modified digital input word prior to outputting the modified digital input word by combining the modified digital input word with the signal.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown.

Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for correcting a mismatch between a first segment and a second segment of a Digital-to-Analog Converter, DAC, wherein the first segment generates a first contribution to an analog output signal of the DAC based on a first number of bits of a digital input word for the DAC, and wherein the second segment generates a second contribution to the analog output signal based on a second number of bits of the digital input word, the apparatus comprising:
   an input configured to receive the digital input word;
   a first processing circuit for the first number of bits comprising a first filter configured to modify the first number of bits in order to generate first modified bits;
   a second processing circuit for the second number of bits comprising a second filter configured to modify the second number of bits in order to generate second modified bits; and
   an output configured to output a modified digital input word for the DAC, wherein the modified digital input word is based on the first modified bits and the second modified bits.

2. The apparatus of claim 1, wherein the first processing circuit further comprises a first extraction circuit configured to extract the first number of bits from the digital input word and to supply the first number of bits to the first filter.

3. The apparatus of claim 1, wherein the second processing circuit further comprises a second extraction circuit configured to extract the second number of bits from the digital input word and to supply the second number of bits to the second filter.

4. The apparatus of claim 1, wherein filter coefficients of the first filter are based on a measured error of the first segment.

5. The apparatus of claim 1, wherein filter coefficients of the second filter are based on a measured error of the second segment.

6. The apparatus of claim 1, further comprising:
   a combiner circuit configured to combine the first modified bits, the second modified bits and the digital input word in order to generate the modified digital input word.

7. The apparatus of claim 6, wherein the combiner circuit comprises:
   a first combiner sub-circuit configured to combine the first modified bits and the second modified bits in order to generate a digital correction word; and
   a second combiner sub-circuit configured to combine the digital input word and the digital correction word in order to generate the modified digital input word.

8. The apparatus of claim 1, further comprising:
   a combiner circuit configured to combine the first modified bits and the second modified bits in order to generate the modified digital input word.

9. The apparatus of claim 6, wherein the combiner circuit is further configured to generate the modified digital input word based on a signal not related to the digital input word.

10. The apparatus of claim 6, further comprising:
    a second combiner circuit coupled between the combiner circuit and the output, wherein the second combiner circuit is configured to modify the modified digital input word by combining the modified digital input word with a signal not related to the digital input word.

11. The apparatus of claim 1, further comprising:
    a second combiner circuit coupled between the input and each of the first processing circuit and the second processing circuit, wherein the second combiner circuit is configured to modify the digital input word by combining the digital input word with a signal not related to the digital input word.

12. The apparatus of claim 9, wherein an amplitude of the signal is lower than a full scale of the DAC.

13. The apparatus of claim 12, wherein the amplitude of the signal is less than 1% of the full scale of the DAC.

14. The apparatus of claim 9, wherein the signal exhibits a frequency outside a frequency passband of the DAC.

15. The apparatus of claim 14, wherein the frequency of the signal is below the frequency passband of the DAC.

16. The apparatus of claim 14, wherein the frequency of the signal is at least one decade below the frequency passband of the DAC.

17. The apparatus of claim 9, wherein the signal is a sinusoidal signal.

18. The apparatus of claim 1, further comprising:
a third processing circuit for a third number of bits of the digital input word used by a third segment of the DAC for generating a third contribution to the analog output signal,
wherein the third processing circuit comprises a third filter configured to modify the third number of bits in order to generate third modified bits, and
wherein the modified digital input word is further based on the third modified bits.

19. The apparatus of claim 18, wherein the third processing circuit further comprises a third extraction circuit configured to extract the third number of bits from the digital input word and provide the third number of bits to the third filter.

20. The apparatus of claim 18, wherein filter coefficients of the third filter are based on a measured error of the third segment.

21. The apparatus of claim 18, wherein the first combiner sub-circuit is configured to combine the first modified bits, the second modified bits and the third modified bits in order to generate the digital correction word.

22. The apparatus of claim 1, further comprising:
a filter adaptation circuit configured to determine respective filter coefficients for the first filter and the second filter based on measured errors of the first segment and the second segment.

23. A Digital-to-Analog Converter, DAC, system, comprising:
the apparatus according to claim 1; and
a DAC coupled to the output of the apparatus.

24. A transmitter, comprising:
a digital-to-analog converter system according to claim 23; and
a digital circuit configured to supply the digital input word to the input.

25. A method for correcting a mismatch between a first segment and a second segment of a Digital-to-Analog Converter, DAC, wherein the first segment generates a first contribution to an analog output signal of the DAC based on a first number of bits of a digital input word for the DAC, and wherein the second segment generates a second contribution to the analog output signal based on a second number of bits of the digital input word, the method comprising:
receiving the digital input word;
modifying the first number of bits in order to generate first modified bits using a first filter in a first processing circuit for the first number of bits;
modifying the second number of bits in order to generate second modified bits using a second filter in a second processing circuit for the second number of bits; and
outputting a modified digital input word for the DAC, wherein the modified digital input word is based on the first modified bits and the second modified bits.

\* \* \* \* \*